(12) United States Patent
Wu et al.

(10) Patent No.: US 12,189,279 B2
(45) Date of Patent: Jan. 7, 2025

(54) HEAT DISSIPATION MODULE AND PROJECTION DEVICE

(71) Applicant: Coretronic Corporation, Hsin-Chu (TW)

(72) Inventors: Pei-Rong Wu, Hsin-Chu (TW); Shi-Wen Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 166 days.

(21) Appl. No.: 17/864,397

(22) Filed: Jul. 14, 2022

(65) Prior Publication Data
US 2023/0020100 A1  Jan. 19, 2023

(30) Foreign Application Priority Data
Jul. 19, 2021 (CN) .......................... 202121631982.6

(51) Int. Cl.
*G03B 21/16* (2006.01)
*G03B 21/14* (2006.01)
*H05K 7/20* (2006.01)
*F28D 21/00* (2006.01)

(52) U.S. Cl.
CPC .......... *G03B 21/16* (2013.01); *G03B 21/145* (2013.01); *H05K 7/20136* (2013.01); *F28D 2021/0028* (2013.01); *F28F 2215/04* (2013.01)

(58) Field of Classification Search
CPC ...... F28D 2021/0028; F28D 2021/0029; F28F 2215/04; G03B 21/145; G03B 21/16; H01L 23/467; H05K 7/20136
See application file for complete search history.

(56) References Cited

U.S. PATENT DOCUMENTS

| 6,343,016 | B1* | 1/2002 | Lin | ..................... H01L 23/3672 257/722 |
| 6,450,251 | B1* | 9/2002 | Lin | ....................... H01L 23/467 165/122 |
| 2003/0141040 | A1* | 7/2003 | Lee | ...................... H01L 23/467 257/E23.099 |
| 2003/0155106 | A1* | 8/2003 | Malone | .................. F28F 13/06 165/185 |

(Continued)

FOREIGN PATENT DOCUMENTS

| CN | 1486131 | 3/2004 |
| WO | WO-2005055689 A1 * | 6/2005 ........... H01L 23/467 |

*Primary Examiner* — Eric S Ruppert
*Assistant Examiner* — Hans R Weiland
(74) *Attorney, Agent, or Firm* — JCIPRNET

(57) ABSTRACT

A heat dissipation module, including a fan and a heat dissipation fin set, is provided. The fan has an air outlet side and an air inlet side opposite to each other. The heat dissipation fin set is configured at the air outlet side and includes a base, first heat dissipation fins, and second heat dissipation fins. The base is divided into a first area and a second area along a direction of a rotation axis of the fan. The first area is located between the air outlet side and the second area. The first heat dissipation fins are connected to the base and located in the first area, and arranged at equal intervals in a configuration direction perpendicular to the direction of the rotation axis. The second heat dissipation fins are connected to the base and located in the second area, and arranged at equal intervals in the configuration direction.

18 Claims, 9 Drawing Sheets

(56) References Cited

U.S. PATENT DOCUMENTS

| | | | | |
|---|---|---|---|---|
| 2003/0227749 | A1* | 12/2003 | Li | H01L 23/467 |
| | | | | 257/E23.099 |
| 2004/0001315 | A1* | 1/2004 | Li | H01L 23/4093 |
| | | | | 257/E23.099 |
| 2004/0194927 | A1* | 10/2004 | Lee | H01L 23/467 |
| | | | | 257/E23.099 |
| 2012/0181000 | A1* | 7/2012 | Zhu | H01L 23/3672 |
| | | | | 165/121 |
| 2014/0014308 | A1* | 1/2014 | Wu | H05K 7/20409 |
| | | | | 165/185 |
| 2014/0092368 | A1* | 4/2014 | Dai | G03B 21/16 |
| | | | | 353/58 |
| 2015/0013944 | A1* | 1/2015 | Lin | F28F 1/32 |
| | | | | 165/121 |
| 2015/0361922 | A1* | 12/2015 | Alvarez | F28D 9/0081 |
| | | | | 165/185 |
| 2017/0241721 | A1* | 8/2017 | Liang | F28F 3/048 |
| 2020/0201151 | A1* | 6/2020 | Wu | G03B 21/145 |

\* cited by examiner

HEAT DISSIPATION MODULE AND PROJECTION DEVICE

CROSS-REFERENCE TO RELATED APPLICATION

This application claims the priority benefit of China application no. 202121631982.6, filed on Jul. 19, 2021. The entirety of the above-mentioned patent application is hereby incorporated by reference herein and made a part of this specification.

BACKGROUND

Technical Field

The disclosure relates to a heat dissipation module and a projection device, and particularly relates to a heat dissipation module with better heat dissipation effect and a projection device adopting the heat dissipation module.

Description of Related Art

Nowadays, the heat dissipator used in a solid-state light source projector usually adopts the forced cooling manner of an axial flow fan with heat dissipation fins, and the fin structure mostly adopts parallel design. With the evolution of products, the requirements for high brightness and low noise products of the user are increasing. Under normal circumstances, more heat is generated by high brightness products. In order to dissipate heat without increasing noise, the temperature must be reduced by increasing the volume of the heat dissipator. With the increase in volume of the projector, the projector becomes bulkier and lacks mobility, the danger of installation is increased, etc. Furthermore, it is worth mentioning that the center motor of the axial flow fan may cause a backflow phenomenon. The reason for the backflow phenomenon is that when an airflow generated by the fan enters the heat dissipator from the first row of fins closest to the air outlet surface, the airflow has not been sorted into a direction parallel to the axis direction of the fan. At this time, if the airflow enters the second row of fins immediately, the airflow collides between the fins and a portion of the airflow rebounds and backflows, such that the heat dissipation efficiency of the fins close to the fan is poor, resulting in insufficient airflow entering the heat dissipator and reducing the heat dissipation efficiency.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a heat dissipation module, which may have better heat dissipation effect.

The disclosure provides a projection device, which includes the heat dissipation module and may have good heat dissipation efficiency.

Other objectives and advantages of the disclosure may be further understood from the technical features disclosed in the disclosure.

In order to achieve one, a part, or all of the above objectives or other objectives, an embodiment of the disclosure provides a heat dissipation module, which includes a fan and a heat dissipation fin set. The fan has an air outlet side and an air inlet side opposite to each other. The heat dissipation fin set is configured at the air outlet side of the fan, and the heat dissipation fin set includes a base, multiple first heat dissipation fins, and multiple second heat dissipation fins. The base is divided into a first area and a second area along a direction of a rotation axis of the fan, and the first area is located between the air outlet side of the fan and the second area. The first heat dissipation fins are connected to the base and are located in the first area, and are arranged at equal intervals in a configuration direction perpendicular to the direction of the rotation axis. The second heat dissipation fins are connected to the base and are located in the second area, and are arranged at equal intervals in the configuration direction. A first interval is between two adjacent first heat dissipation fins among the first heat dissipation fins, a second interval is between two adjacent second heat dissipation fins among the second heat dissipation fins, and the first interval is less than the second interval.

In order to achieve one, a part, or all of the above objectives or other objectives, an embodiment of the disclosure provides a projection device, which includes a case, an optical engine, and a heat dissipation module. The optical engine is configured in the case, and the optical engine includes a light source, a light valve, and a projection lens. The light source is suitable for generating an illumination beam, the light valve is suitable for converting the illumination beam into an image beam, and the projection lens is suitable for converting the image beam into a projection beam. The heat dissipation module is configured in the case, and the heat dissipation module includes a fan and a heat dissipation fin set. The fan has an air outlet side and an air inlet side opposite to each other. The heat dissipation fin set is configured at the air outlet side of the fan, and the heat dissipation fin set includes a base, multiple first heat dissipation fins, and multiple second heat dissipation fins. The base is divided into a first area and a second area along a direction of a rotation axis of the fan, and the first area is located between the air outlet side of the fan and the second area. The first heat dissipation fins are connected to the base and are located in the first area, and are arranged at equal intervals in a configuration direction perpendicular to the direction of the rotation axis. The second heat dissipation fins are connected to the base and are located in the second area, and are arranged at equal intervals in the configuration direction. There is a first interval between two adjacent first heat dissipation fins among the first heat dissipation fins, there is a second interval between two adjacent second heat dissipation fins among the second heat dissipation fins, and the first interval is less than the second interval.

Based on the above, the embodiments of the disclosure have at least one of the following advantages or effects. In the design of the heat dissipation module of the disclosure, the first area of the base is between the air outlet side of the fan and the second area, and the first interval between the first heat dissipation fins located in the first area is less than the second interval between the second heat dissipation fins located in the second area. In this way, when an airflow generated by the fan enters the first heat dissipation fins, the airflow may be guided by the first heat dissipation fins, thereby solving the issue of backflow generated by the fan at the center. In addition, the airflow flowing through the first heat dissipation fins may be guided into the second heat dissipation fins more effectively, thereby increasing the heat convection efficiency of the overall heat dissipation module. In addition, adopting the projection device of the heat dissipation module of the disclosure may increase the heat dissipation efficiency without increasing the number of fans and the rotation speed to avoid the generation of system noise.

Other objectives, features and advantages of the disclosure will be further understood from the further technological features disclosed by the embodiments of the disclosure wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
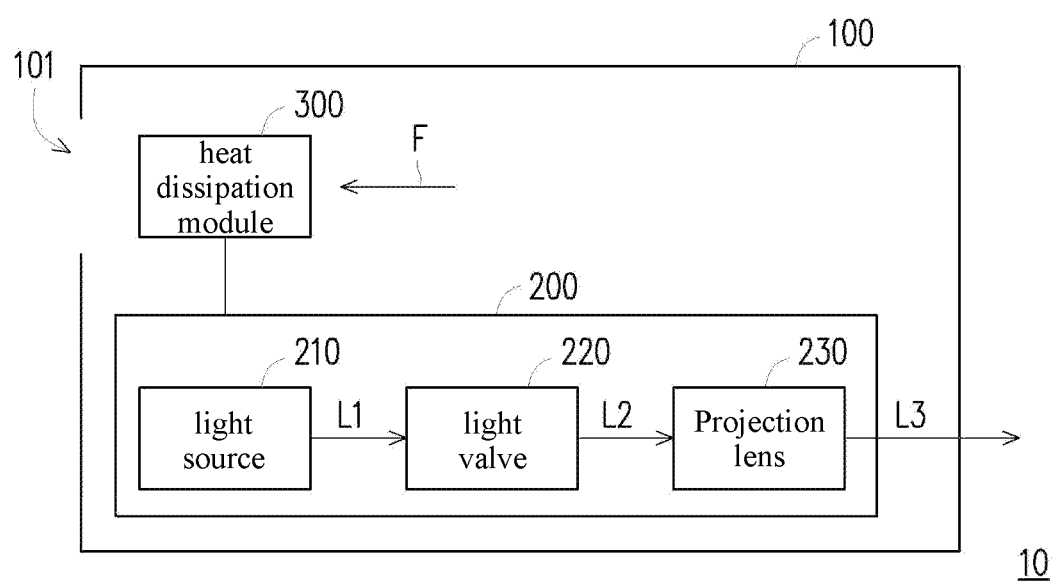
FIG. 1 is a schematic diagram of a projection device according to an embodiment of the disclosure.

FIG. 1 is a schematic diagram of a projection device according to an embodiment of the disclosure. Please refer to FIG. 1. A projection device 10 of the embodiment includes a case 100, an optical engine 200, and a heat dissipation module 300. The optical engine 200 and the heat dissipation module 300 are configured in the case 100. The optical engine 200 includes a light source 210, a light valve 220, and a projection lens 230. The light source 210 is suitable for generating an illumination beam L1, the light valve 220 is suitable for converting the illumination beam L1 into an image beam L2, and the projection lens 230 is suitable for converting the image beam L2 into a projection beam L3. It means that the projection lens 230 is adapted to enlarge the image beam L2 to become the projection beam L3. In other words, the light source 210 is configured to emit the illumination beam L1, which is converted by the light valve 220, and is the projected to a display screen (not shown) outside the projection device 10 through the projection lens 230. Here, the light source 210 is, for example, a light-emitting diode, a laser diode, a high-pressure mercury lamp, or other suitable light sources.

Furthermore, the light valve 220 used in the embodiment is, for example, a reflective light modulator such as a liquid crystal on silicon panel (LCoS panel) and a digital micromirror device (DMD). In an embodiment, the light valve 220 is, for example, a transmissive optical modulator such as a transparent liquid crystal panel, an electro-optical modulator, a magneto-optical modulator, and an acousto-optical modulator (AOM), but the embodiment does not limit the form and type of the light valve 220. The detailed steps and implementation manners of the method of the light valve 220 modulating the illumination beam L1 into the projection beam L3 may be obtained from conventional knowledge in the art with sufficient teaching, suggestion, and implementation description, so there will be no repetition. In addition, the projection lens 230 includes, for example, a combination of one or more optical lens elements with refractive power, such as various combinations of non-planar lens elements including bi-concave lens elements, bi-convex lens elements, concave-convex lens elements, convex-concave lens elements, plano-convex lens elements, plano-concave lens elements, etc. In an embodiment, the projection lens 230 may also include a planar optical lens element, which converts the image beam L2 from the light valve 220 into the projection beam L3 in a reflective or transmissive manner to be projected out of the projection device 10. Here, in the embodiment, the form and type of the projection lens 230 are not limited. The heat dissipation module 300 is configured in the case 100. The case 100 has at least one air outlet 101. Through the at least one air outlet 101, an airflow is guided out of the case 100 of the projection device 10 through the heat dissipation module 300.

Figure 2A:
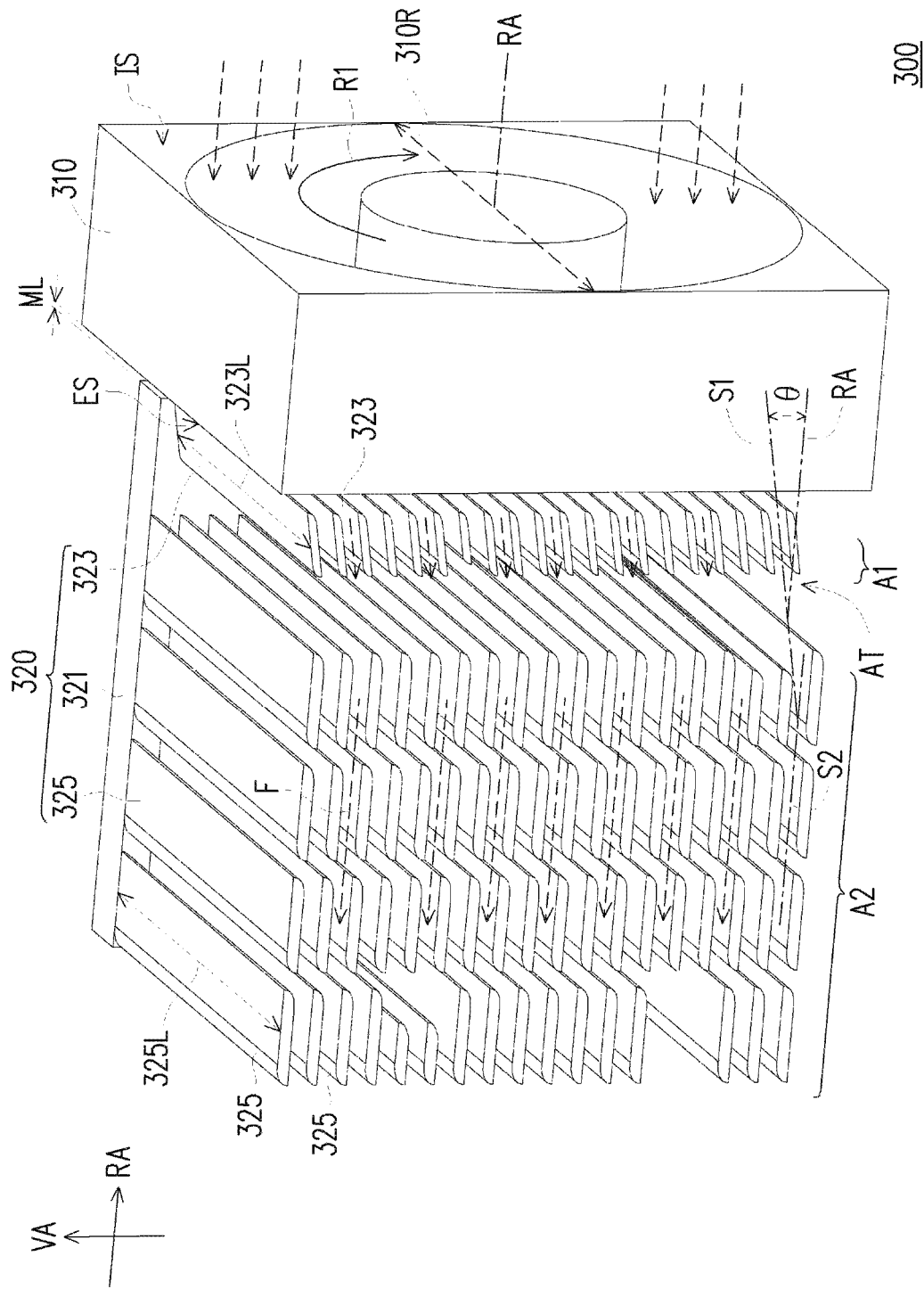
FIG. 2A is a three-dimensional schematic diagram of a heat dissipation module according to an embodiment of the disclosure.
Figure 2B:
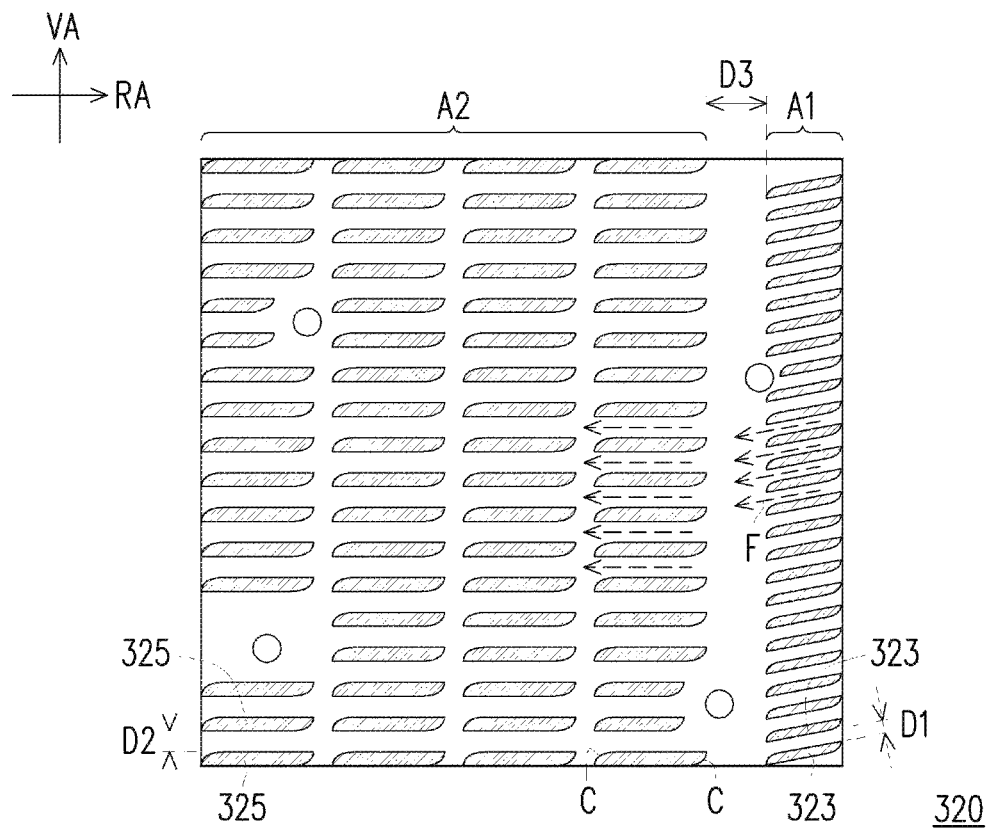
FIG. 2B is a side schematic diagram of the heat dissipation module of FIG. 2A.

FIG. 2A is a three-dimensional schematic diagram of a heat dissipation module according to an embodiment of the disclosure. FIG. 2B is a side schematic diagram of the heat dissipation module of FIG. 2A. Please refer to FIG. 1, FIG. 2A, and FIG. 2B at the same time. In the embodiment, the heat dissipation module 300 includes a fan 310 and a heat dissipation fin set 320. The fan 310 has an air outlet side ES and an air inlet side IS opposite to each other, and the heat dissipation fin set 320 is located between the fan 310 and the at least one air outlet 101. The heat dissipation fin set 320 is configured at the air outlet side ES. Thereby, the heat absorbed by the heat dissipation fin set 320 can exchange heat with the airflow generated by the fan 310, and the airflow is discharged out of the projection device 10 to achieve the heat dissipation effect. Here, the fan 310 is embodied as an axial flow fan. Preferably, there is a distance ML between the fan 310 and the heat dissipation fin set 320. A range of the distance ML is, for example, 0 to 15 mm to achieve the best heat dissipation efficiency.

Furthermore, in the embodiment, the heat dissipation fin set 320 includes a base 321, multiple first heat dissipation fins 323, and multiple second heat dissipation fins 325. The base 321 may be connected to the light source 210 (refer to FIG. 1) to absorb the heat generated by the light source 210 by heat conduction. Then, the first heat dissipation fins 323 and the second heat dissipation fins 325 are used to help dissipate heat. In other words, the heat dissipation fin set 320 conducts the heat generated by the light source 210 to the heat dissipation fin set 320. Here, the base 321, the first heat dissipation fins 323, and the second heat dissipation fins 325 are, for example, an integrally formed structure made by forging or casting. In another embodiment, the first heat dissipation fins 323 and the second heat dissipation fins 325 may also be fixed to the base 321 by bonding (for example, welding), which is not limited by the disclosure. Preferably, the material of the base 321, the first heat dissipation fins 323, and the second heat dissipation fins 325 is, for example, metal aluminum with good thermal conductivity, and the disclosure is not limited thereto.

Please refer to FIG. 2A and FIG. 2B at the same time. In the embodiment, the base 321 of the heat dissipation fin set 320 may be divided into a first area A1 and a second area A2 along a direction of a rotation axis RA of the fan 310. The first area A1 is located between the air outlet side ES of the fan 310 and the second area A2. The first heat dissipation fins 323 are connected to the base 321 and are located in the first area A1. In other words, the first heat dissipation fins 323 are closer to the fan 310. The second heat dissipation fins 325 are connected to the base 321 and are located in the second area A2. In other words, the second heat dissipation fins 325 are further from the fan 310. In short, after the airflow F flows out from the air outlet side ES of the fan 310, the airflow F sequentially passes through the first heat dissipation fins 323 and the second heat dissipation fins 325. Furthermore, the first heat dissipation fins 323 are arranged at equal intervals in a configuration direction VA perpendicular to the rotation axis RA, and there is a first interval D1 between two adjacent first heat dissipation fins 323. The second heat dissipation fins 325 are arranged at equal intervals in the configuration direction VA, and there is a second interval D2 between two adjacent second heat dissipation fins 325. In particular, the first interval D1 is less than the second interval D2, that is, the interval between the second heat dissipation fins 325 is greater than the interval between the first heat dissipation fins 323. Here, the second heat dissipation fins 325 are also arranged at equal intervals along the direction of the rotation axis RA. In other words, the second heat dissipation fins 325 are arranged in a matrix on a plane formed by the direction of the rotation axis RA and the configuration direction VA. In addition, a third interval D3 is between the first area A1 and the second area A2, and the third interval D3 is greater than the first interval D1 and the third interval D3 is greater than the second interval D2.

In detail, in the embodiment, the first interval D1 is less than the second interval D2. Therefore, after the airflow F enters the heat dissipation fin set 320, it is difficult to backflow from the first heat dissipation fins 323 again. In other words, through the wider design of the second interval D2, the airflow F may flow between the second heat dissipation fins 325 more smoothly, which may improve the efficiency of heat exchange between the second heat dissipation fins 325 and the airflow F, and effectively avoid backflow. Furthermore, before the airflow F enters the second area A2 after flowing through the first area A1, the airflow F may be sorted at the third interval D3. When the third interval D3 is sufficiently large, the airflow F may be guided into an airflow nearly parallel to the rotation axis RA. In this way, in the embodiment, the generation of backflow may be reduced, and more airflow F may enter the second heat dissipation fins 325, thereby improving the heat dissipation efficiency of the heat dissipation module 300. Preferably, the third interval D3 is, for example, greater than 5 mm, but the disclosure is not limited thereto.

As shown in FIG. 2A and FIG. 2B, in the embodiment, an extending direction S1 of the first heat dissipation fin 323 is not parallel to an extending direction S2 of the second heat dissipation fin 325, the extending direction S1 of the first heat dissipation fin 323 is not parallel to the direction of the rotation axis RA, and there is an included angle θ between the extending direction S1 of the first heat dissipation fin and the rotation axis RA. In this way, the first heat dissipation fin 323 and the second heat dissipation fin 325 of the disclosure have the effect of guiding the airflow in addition to the heat dissipation effect. In detail, the extending direction S1 of the first heat dissipation fin 323 needs to be determined by the relative position of the fan 310 and the rotation direction of the fan to prevent the airflow F from being blocked by the base 321 of the heat dissipation fin set 320.

More specifically, in the embodiment, viewing from the air inlet side IS, the base 321 of the heat dissipation fin set 320 is located on the right side of the rotation axis RA, and when the rotation direction of the fan 310 is clockwise R1, the included angle θ between the extending direction S1 of the first heat dissipation fin 323 and the rotation axis RA is an acute angle. Since the clockwise R1 airflow is a downward airflow when passing through the base 321, the first heat dissipation fin 323 is inclined downward for the airflow to enter more smoothly.

Please continue to refer to FIG. 2A. In the embodiment, each first heat dissipation fin 323 has a first length 323L, each second heat dissipation fin 325 has a second length 325L, and the second length 325L is greater than the first length 323L. Through the above design, on the other side of the first area A1 relative to the base 321, that is, between the first row of the second heat dissipation fin 325 and the first heat dissipation fin 323 in the configuration direction VA, an unblocked channel AT is formed. When there is no blockage, the airflow F may enter the second heat dissipation fins 325 via the channel AT more smoothly, thereby improving the heat dissipation efficiency. Preferably, the first length 323L of the first heat dissipation fin 323 is greater than $2/3 \pm 10\%$ of an outer diameter 310R of the fan 310, so that most of the airflow on the air outlet side ES of the fan 310 may be guided, thereby reducing the probability of backflow. The design of the disclosure may be more effective. Of course, the disclosure is not limited thereto.

Please refer to FIG. 2B again. In the embodiment, each second heat dissipation fin 325 also has a rounded corner C, but the disclosure is not limited thereto. When the airflow F flows through the second heat dissipation fin 325, the rounded corner C may achieve a better guiding effect of the airflow F and enable the airflow F to have a larger downward flow rate. In other words, in the embodiment, when the included angle θ between the extending direction S1 of the first heat dissipation fin 323 and the rotation axis RA is an acute angle, in conjunction with the second heat dissipation fin 325 with the rounded corner C, the airflow F may be guided more effectively to improve the heat dissipation effect. In addition, the rounded corner C may also help reduce the air flow resistance.

In short, in the design of the heat dissipation module 300 of the embodiment, the first area A1 of the base 321 is between the air outlet side ES of the fan 310 and the second area A2. The first interval D1 between the first heat dissipation fins 323 located in the first area A1 is less than the second interval D2 between the second heat dissipation fins 325 located in the second area A2. In this way, when the airflow generated by the fan 310 enters the first heat dissipation fin 323, the airflow may be guided by the first heat dissipation fin 323, thereby solving the issue of backflow generated by the fan 310 at the center. Furthermore, the airflow flowing through the first heat dissipation fin 323 may be guided into the second heat dissipation fin 325 more effectively, thereby increasing the heat convection efficiency of the overall heat dissipation module 300. In addition, adopting the projection device 10 of the heat dissipation module 300 of the disclosure may increase the heat dissipation efficiency without increasing the number of fans 310 and the rotation speed to avoid the generation of system noise.

It must be noted here that the following embodiments continue to use the reference numerals and some content of the foregoing embodiment. The same reference numerals are adopted to represent the same or similar elements, and the description of the same technical content is omitted. For the description of the omitted parts, reference may be made to the foregoing embodiment, which will not be repeated in the following embodiments.

Figure 3:
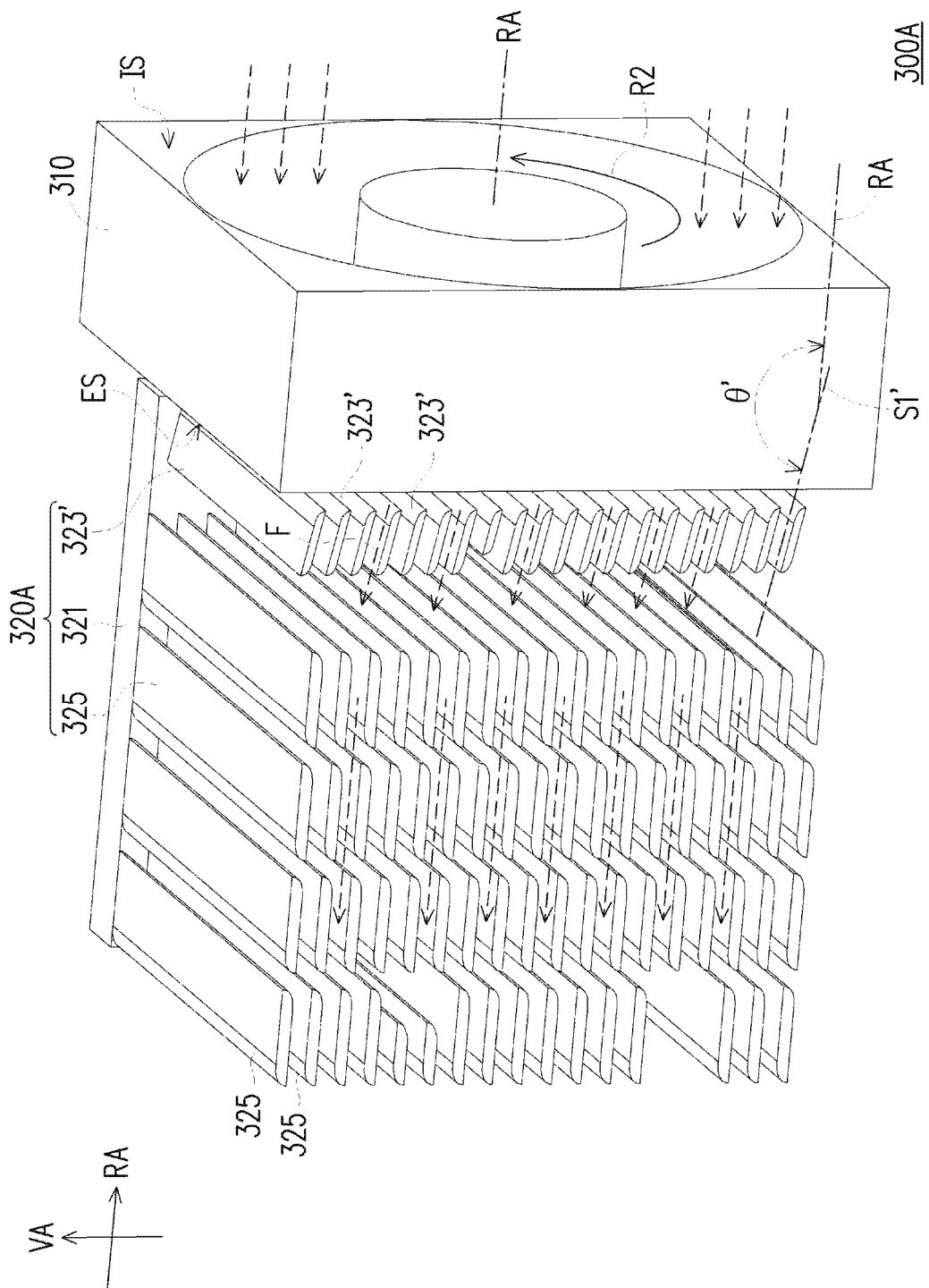
FIG. 3 is a three-dimensional schematic diagram of a heat dissipation module according to another embodiment of the disclosure.

FIG. 3 is a three-dimensional schematic diagram of a heat dissipation module according to another embodiment of the disclosure. Please refer to FIG. 2A and FIG. 3 at the same time. A heat dissipation module 300A of the embodiment is similar to the heat dissipation module 300 of FIG. 2A, and the difference between the two is that: viewing from the air inlet side IS, the base 321 of a heat dissipation fin set 320A is located on the right side of the rotation axis RA, and when the fan 310 rotates counterclockwise R2, an included angle θ' between an extending direction S1' of the first heat dissipation fin 323 and the rotation axis RA is an obtuse angle. Since the airflow F in the counterclockwise R2 direction is an upward airflow when flowing through the base 321, a first heat dissipation fin 323' is designed to be at an upwardly inclined angle to enable the airflow F to enter the second heat dissipation fin 325 more smoothly.

Figure 4A:
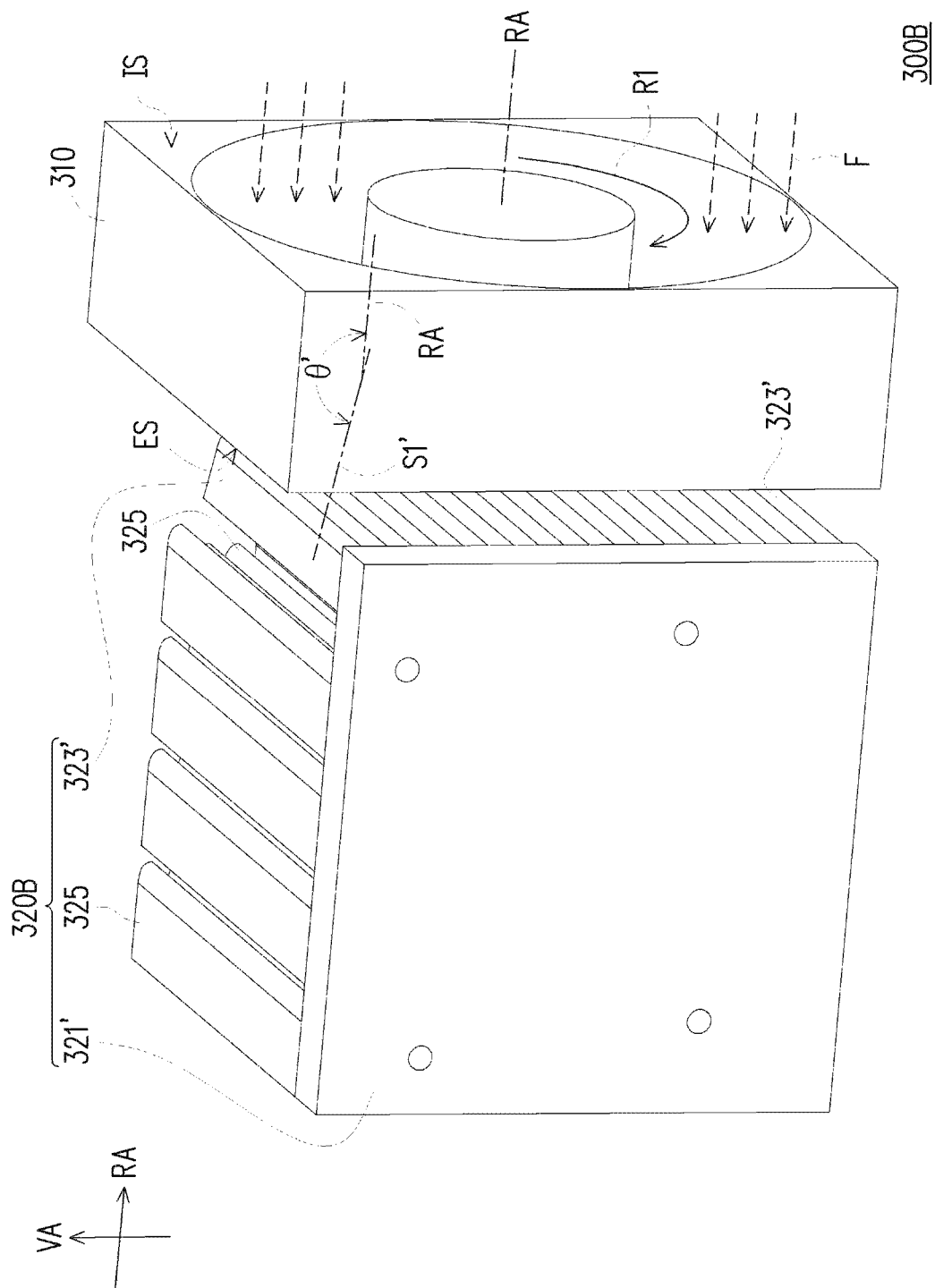
FIG. 4A to FIG. 4B are three-dimensional schematic diagrams of various heat dissipation modules according to multiple embodiments of the disclosure.
Figure 4B:
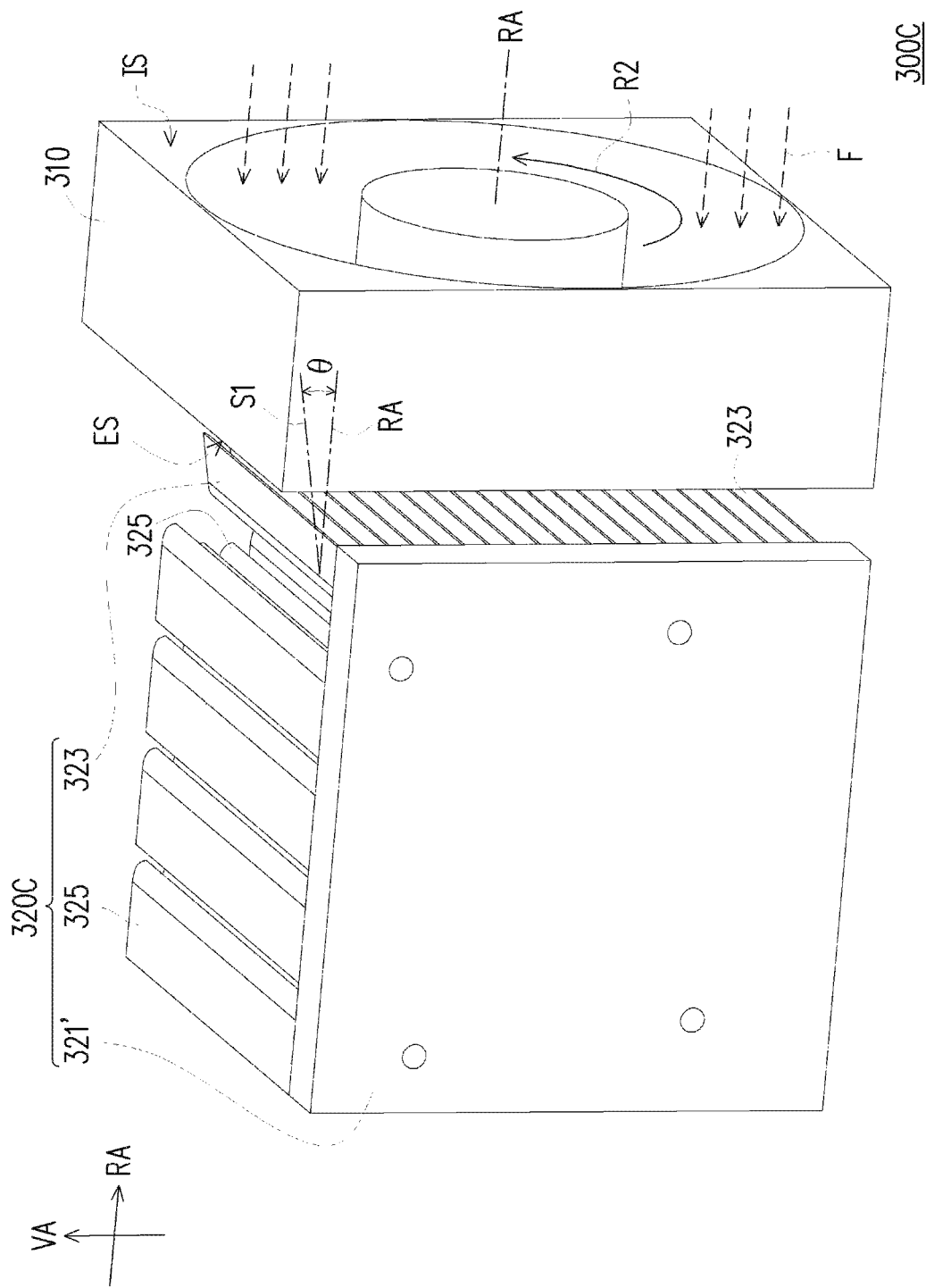
Figure 5A:
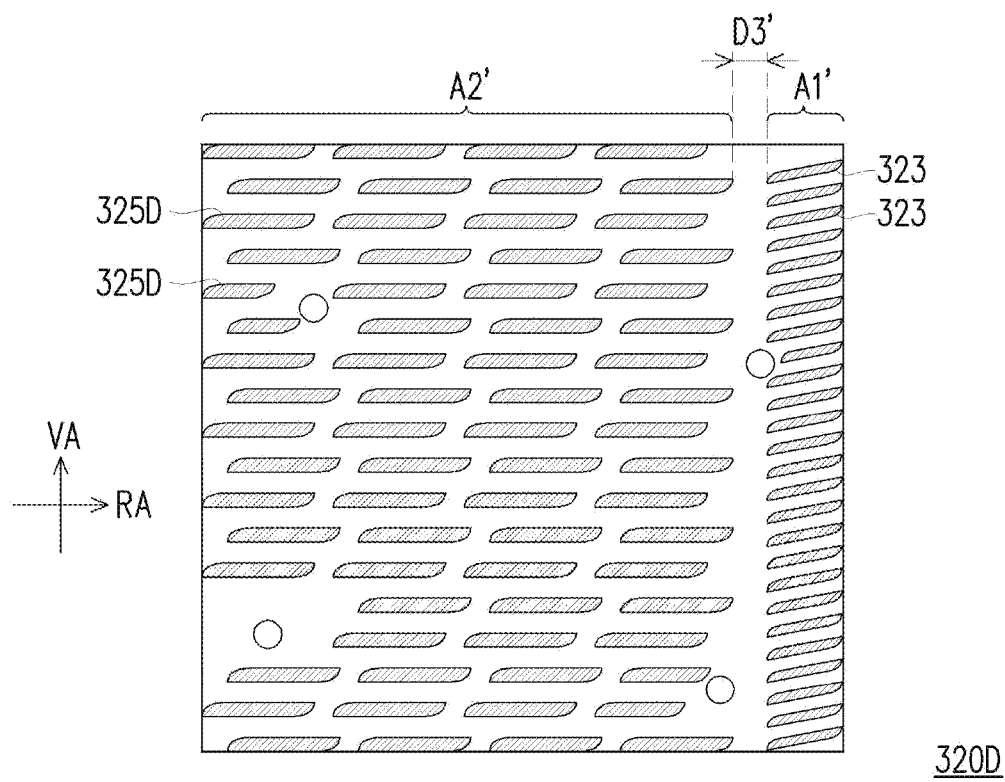
FIG. 5A to FIG. 5E are side schematic diagrams of various heat dissipation fin sets of the heat dissipation modules according to multiple embodiments of the disclosure.
Figure 5B:
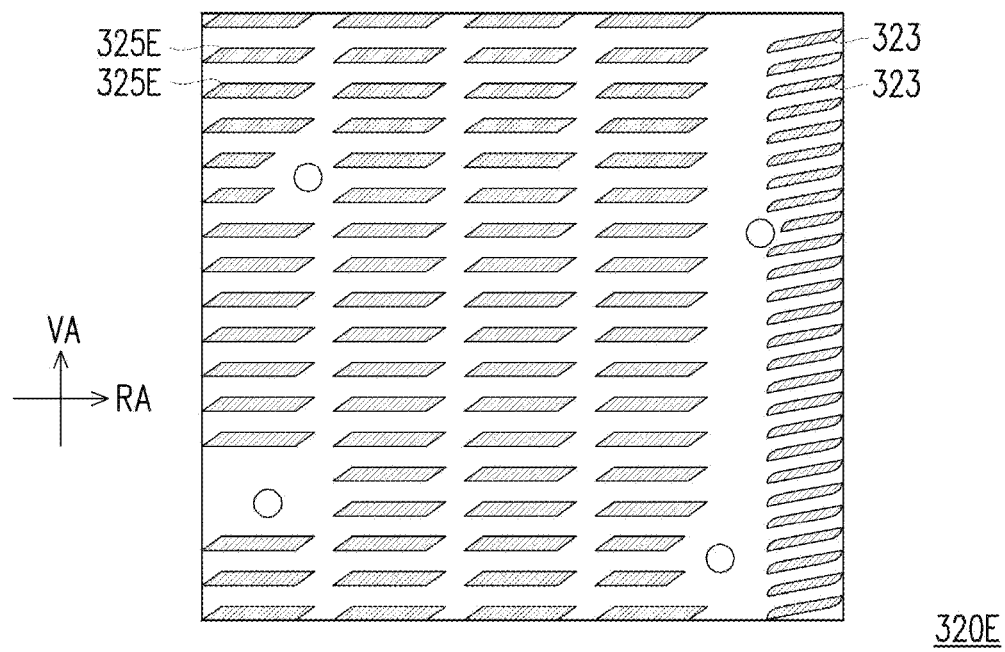
Figure 5C:
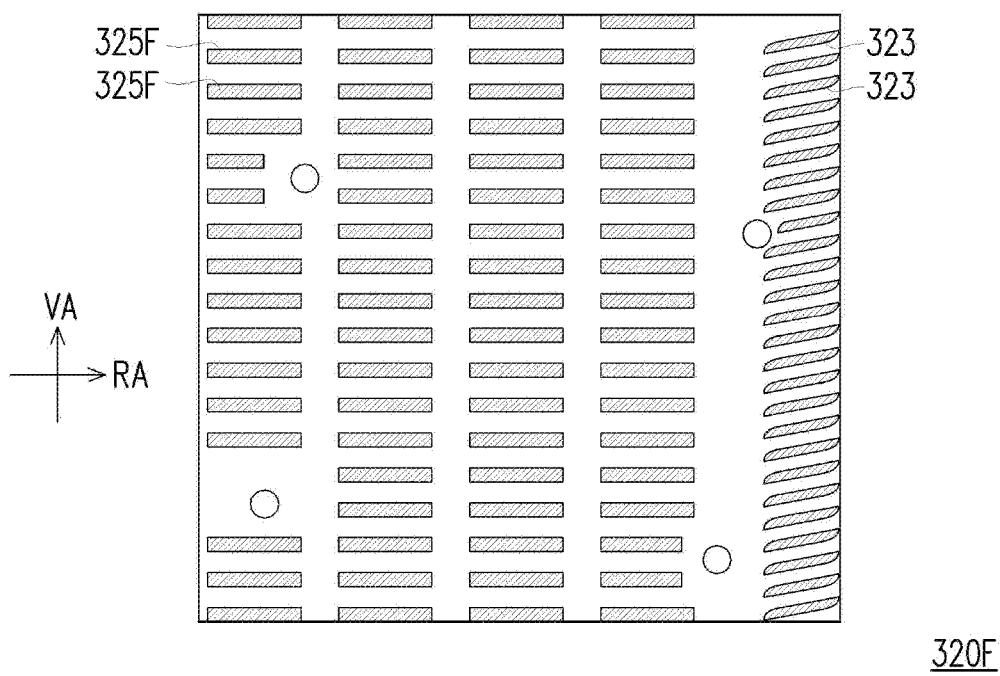
Figure 5D:
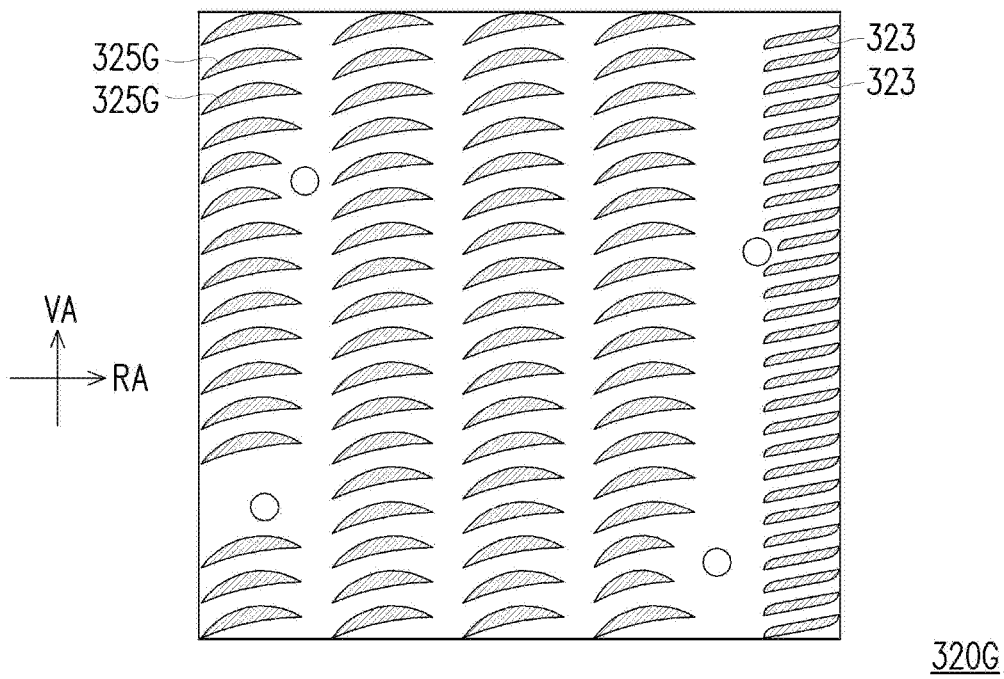
Figure 5E:
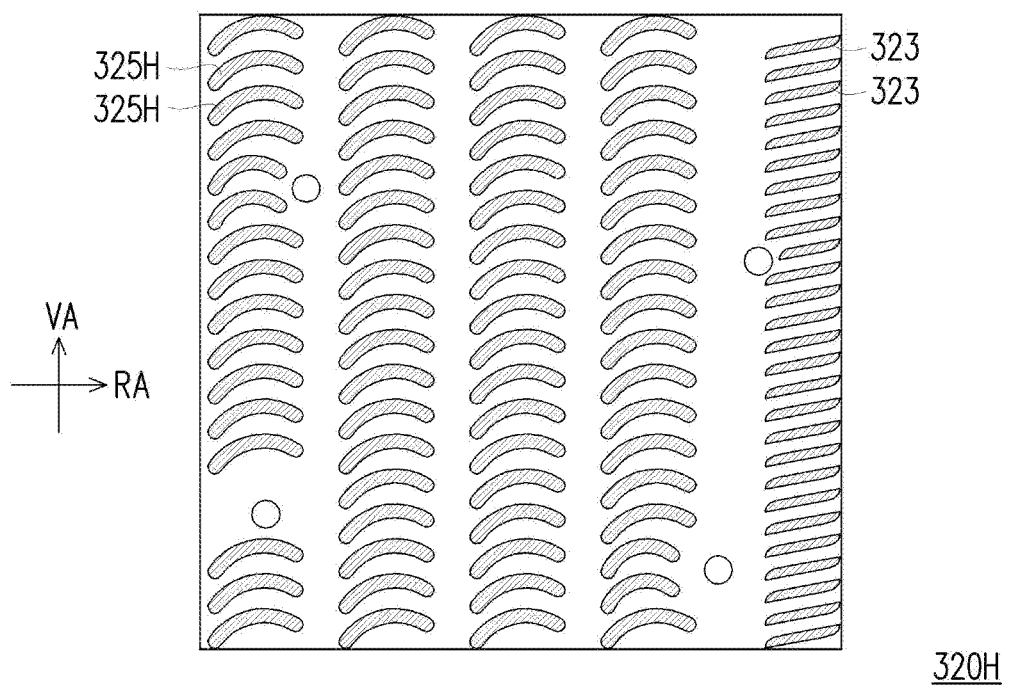

FIG. 4A to FIG. 4B are three-dimensional schematic diagrams of various heat dissipation modules according to multiple embodiments of the disclosure. Please refer to FIG. 2A and FIG. 4A at the same time. A heat dissipation module 300B of the embodiment is similar to the heat dissipation module 300 of FIG. 2A, and the difference between the two is that: viewing from the air inlet side IS, a base 321' of a heat dissipation fin set 320B is located on the left side of the rotation axis RA, and the rotation direction of the fan 310 is clockwise R1. Since the airflow F in the clockwise R1 direction is an upward airflow when flowing through the heat dissipation fin set 320B, the first heat dissipation fin 323' is designed to be at an upwardly inclined angle. In other words, when the included angle θ' between the extending direction SF of the first heat dissipation fin 323' and the rotation axis RA is an obtuse angle, the airflow F may enter the second heat dissipation fin 325 more smoothly.

Please refer to FIG. 2A and FIG. 4B at the same time. A heat dissipation module 300C of the embodiment is similar to the heat dissipation module 300 of FIG. 2A, and the difference between the two is that: viewing from the air inlet side IS, the base 321' of a heat dissipation fin set 320C is located on the left side of the rotation axis RA, and the rotation direction of the fan 310 is counterclockwise R2. Since the airflow F in the counterclockwise R2 direction is a downward airflow when flowing through the heat dissipation fin set 320C, the first heat dissipation fin 323 is designed to be at a downwardly inclined angle. In other words, the included angle θ between the extending direction S1 of the first heat dissipation fin 323 and the rotation axis RA is an acute angle, which enables the airflow F to enter the second heat dissipation fin 325 more smoothly.

FIG. 5A to FIG. 5E are side schematic diagrams of various heat dissipation fin sets of the heat dissipation modules according to multiple embodiments of the disclosure. First, please refer to FIG. 5A. Second heat dissipation fins 325D of a heat dissipation fin set 320D are alternately arranged on a plane formed by the direction of the rotation axis RA and the configuration direction VA. Since the alternating arrangement may further strengthen changes in the flow field, as long as a third interval D3' between a first area A1' and a second area A2' is greater than 3 mm, the same effects can be achieved.

In addition, the embodiment does not limit the shape of the second heat dissipation fin. In detail, in FIG. 5B, the shape of a second heat dissipation fin 325E of a heat dissipation fin set 320E is, for example, a parallelogram. Alternatively, in FIG. 5C, the shape of a second heat dissipation fin 325F of a heat dissipation fin set 320F is, for example, a rectangle. Alternatively, in FIG. 5D, the shape of a second heat dissipation fin 325G of a heat dissipation fin set 320G is, for example, a semi-elliptical shape. Alternatively, in FIG. 5E, the shape of a second heat dissipation fin 325H of a heat dissipation fin set 320H is, for example, an arc.

In summary, the embodiments of the disclosure have at least one of the following advantages or effects. In the design of the heat dissipation module of the disclosure, the first area of the base is between the air outlet side of the fan and the second area, and the first interval between the first heat dissipation fins located in the first area is less than the second interval between the second heat dissipation fins located in the second area. In this way, when the airflow generated by the fan enters the first heat dissipation fins, the airflow may be guided by the first heat dissipation fins, thereby solving the issue of backflow generated by the fan at the center. In addition, the airflow flowing through the first heat dissipation fins may be guided into the second heat dissipation fins more effectively, thereby increasing the heat convection efficiency of the overall heat dissipation module. In addition, adopting the projection device of the heat dissipation module of the disclosure may increase the heat dissipation efficiency without increasing the number of fans and the rotation speed to avoid the generation of system noise.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A heat dissipation module, comprising a fan and a heat dissipation fin set, wherein:
    the fan has an air outlet side and an air inlet side opposite to each other; and
    the heat dissipation fin set is configured to be disposed at the air outlet side of the fan and the heat dissipation fin set comprises a base, a plurality of first heat dissipation fins, and a plurality of second heat dissipation fins, wherein:
        the base has a first area and a second area, and the first area and the second area are arranged along a direction of a rotation axis of the fan, and the first area is located between the air outlet side of the fan and the second area;
        the plurality of first heat dissipation fins are connected to the base and are located in the first area, and are arranged at equal intervals in a configuration direction perpendicular to the direction of the rotation axis; and
        the plurality of second heat dissipation fins are connected to the base and are located in the second area, and are arranged at equal intervals in the configuration direction, wherein
        a first interval is between two adjacent first heat dissipation fins among the plurality of first heat dissipation fins, a second interval is between two adjacent second heat dissipation fins among the plurality of second heat dissipation fins, and the first interval is less than the second interval,
        wherein a third interval is between the first area and the second area, and the third interval is greater than the first interval and the third interval is greater than the second interval.

2. The heat dissipation module of claim 1, wherein the plurality of second heat dissipation fins are arranged in a matrix in the direction of the rotation axis, and the third interval is greater than 5 mm.

3. The heat dissipation module of claim 1, wherein the plurality of second heat dissipation fins are alternately arranged in the direction of the rotation axis, and the third interval is greater than 3 mm.

4. The heat dissipation module of claim 1, wherein each of the plurality of first heat dissipation fins has a first length, each of the plurality of second heat dissipation fins has a second length, and the second length is greater than the first length.

5. The heat dissipation module of claim 4, wherein the first length is greater than $2/3 \pm 10\%$ of an outer diameter of the fan.

6. The heat dissipation module of claim 1, wherein a distance is between the fan and the heat dissipation fin set, and a range of the distance is 0 to 15 mm.

7. The heat dissipation module of claim 1, wherein an extending direction of the plurality of first heat dissipation fins is not parallel to an extending direction of the second heat dissipation fin.

8. The heat dissipation module of claim 1, wherein an included angle is between an extending direction of each of the plurality of first heat dissipation fins and the direction of the rotation axis.

9. The heat dissipation module of claim 8, wherein viewing from the air inlet side, the base of the heat dissipation fin set is located on a right side of the direction of the rotation axis, and when the fan rotates clockwise, the included angle is an acute angle.

10. The heat dissipation module of claim 8, wherein viewing from the air inlet side, the base of the heat dissipation fin set is located on a right side of the direction of the rotation axis, and when the fan rotates counterclockwise, the included angle is an obtuse angle.

11. The heat dissipation module of claim 8, wherein viewing from the air inlet side, the base of the heat dissipation fin set is located on a left side of the direction of the rotation axis, and when the fan rotates clockwise, the included angle is an obtuse angle.

12. The heat dissipation module of claim 8, wherein viewing from the air inlet side, the base of the heat dissipation fin set is located on a left side of the direction of the rotation axis, and when the fan rotates counterclockwise, the included angle is an acute angle.

13. The heat dissipation module of claim 1, wherein a shape of each of the plurality of second heat dissipation fins comprises a parallelogram, a rectangle, or an arc.

14. The heat dissipation module of claim 1, wherein each of the plurality of second heat dissipation fins has a rounded corner.

15. The heat dissipation module of claim 1, wherein the fan is an axial flow fan.

16. A projection device, comprising a case, an optical engine, and a heat dissipation module, wherein:
the optical engine is configured in the case and comprises a light source, a light valve, and a projection lens, wherein:
the light source is suitable for generating an illumination beam;
the light valve is suitable for converting the illumination beam into an image beam; and
the projection lens is suitable for converting the image beam into a projection beam; and
the heat dissipation module is configured in the case and comprises a fan and a heat dissipation fin set, wherein:
the fan has an air outlet side and an air inlet side opposite to each other; and
the heat dissipation fin set is configured to be disposed at the air outlet side of the fan and the heat dissipation fin set comprises a base, a plurality of first heat dissipation fins, and a plurality of second heat dissipation fins, wherein:
the base has a first area and a second area, and the first area and the second area are arranged along a direction of a rotation axis of the fan, wherein the first area is located between the air outlet side of the fan and the second area, and the fan is located between the projection lens and the heat dissipation fin set;
the plurality of first heat dissipation fins are connected to the base and are located in the first area, and are arranged at equal intervals in a configuration direction perpendicular to the direction of the rotation axis; and
the plurality of second heat dissipation fins are connected to the base and are located in the second area, and are arranged at equal intervals in the configuration direction, wherein
a first interval is between two adjacent first heat dissipation fins among the plurality of first heat dissipation fins, a second interval is between two adjacent second heat dissipation fins among the plurality of second heat dissipation fins, and the first interval is less than the second interval,
wherein a third interval is between the first area and the second area, and the third interval is greater than the first interval and the third interval is greater than the second interval.

17. The projection device of claim 16, wherein the plurality of second heat dissipation fins are arranged in a matrix in the direction of the rotation axis, and the third interval is greater than 5 mm.

18. The projection device of claim 16, wherein the plurality of second heat dissipation fins are alternately arranged in the direction of the rotation axis, and the third interval is greater than 3 mm.

* * * * *